United States Patent
Satoh et al.

(10) Patent No.: US 11,579,231 B2
(45) Date of Patent: Feb. 14, 2023

(54) MAGNETIC RESONANCE IMAGING APPARATUS, IMAGE PROCESSING APPARATUS, AND PHASE CORRECTING METHOD

(71) Applicant: FUJIFILM Healthcare Corporation, Chiba (JP)

(72) Inventors: Ryota Satoh, Chiba (JP); Keisuke Nishio, Chiba (JP); Yasuhiro Kamada, Chiba (JP); Yoshitaka Sato, Chiba (JP); Masahiro Takizawa, Chiba (JP); Toru Shirai, Chiba (JP)

(73) Assignee: FUJIFILM Healthcare Corporation, Chiba (JP)

( * ) Notice: Subject to any disclaimer, the term of this patent is extended or adjusted under 35 U.S.C. 154(b) by 0 days.

(21) Appl. No.: 17/645,075

(22) Filed: Dec. 20, 2021

(65) Prior Publication Data

US 2022/0221543 A1 Jul. 14, 2022

(30) Foreign Application Priority Data

Jan. 8, 2021 (JP) .............................. JP2021-002001

(51) Int. Cl.
  *G01R 33/565* (2006.01)
  *G01R 33/56* (2006.01)
  *G01R 33/561* (2006.01)
(52) U.S. Cl.
  CPC ... *G01R 33/56554* (2013.01); *G01R 33/5608* (2013.01); *G01R 33/5611* (2013.01); *G01R 33/5616* (2013.01)

(58) Field of Classification Search
  CPC .......... G01R 33/56554; G01R 33/5608; G01R 33/5611; G01R 33/5616
  See application file for complete search history.

(56) References Cited

U.S. PATENT DOCUMENTS

| 2020/0018809 A1* | 1/2020 | Duijndam ........ G01R 33/56518 |
| 2020/0300947 A1* | 9/2020 | Wang .................. G01R 33/4818 |
| 2020/0326398 A1* | 10/2020 | Zhou .................. G01R 33/5618 |

FOREIGN PATENT DOCUMENTS

| JP | 6283134 | 2/2018 |
| JP | 6348355 | 6/2018 |
| JP | 2019-162370 | 9/2019 |

* cited by examiner

*Primary Examiner* — Gregory H Curran
(74) *Attorney, Agent, or Firm* — Paul Teng

(57) ABSTRACT

To provide a technique in which, in imaging using an EPI method, an occurrence of an artifact when phase correction is performed for each channel is avoided and the phase correction is accurately performed. A common phase correction value to be applied to data of all channels is calculated using pre-scan data of each channel. The common phase correction value is obtained by combining a difference phase obtained for each of the channels. The difference phase is obtained by complex integration, while an absolute value of each channel is maintained as it is. The combination is performed by complex average, and averaging processing according to a weight of the absolute value is performed. The occurrence of an artifact can be prevented by using the common phase correction value, and robust phase correction can be performed by including the weight of the absolute value.

15 Claims, 15 Drawing Sheets

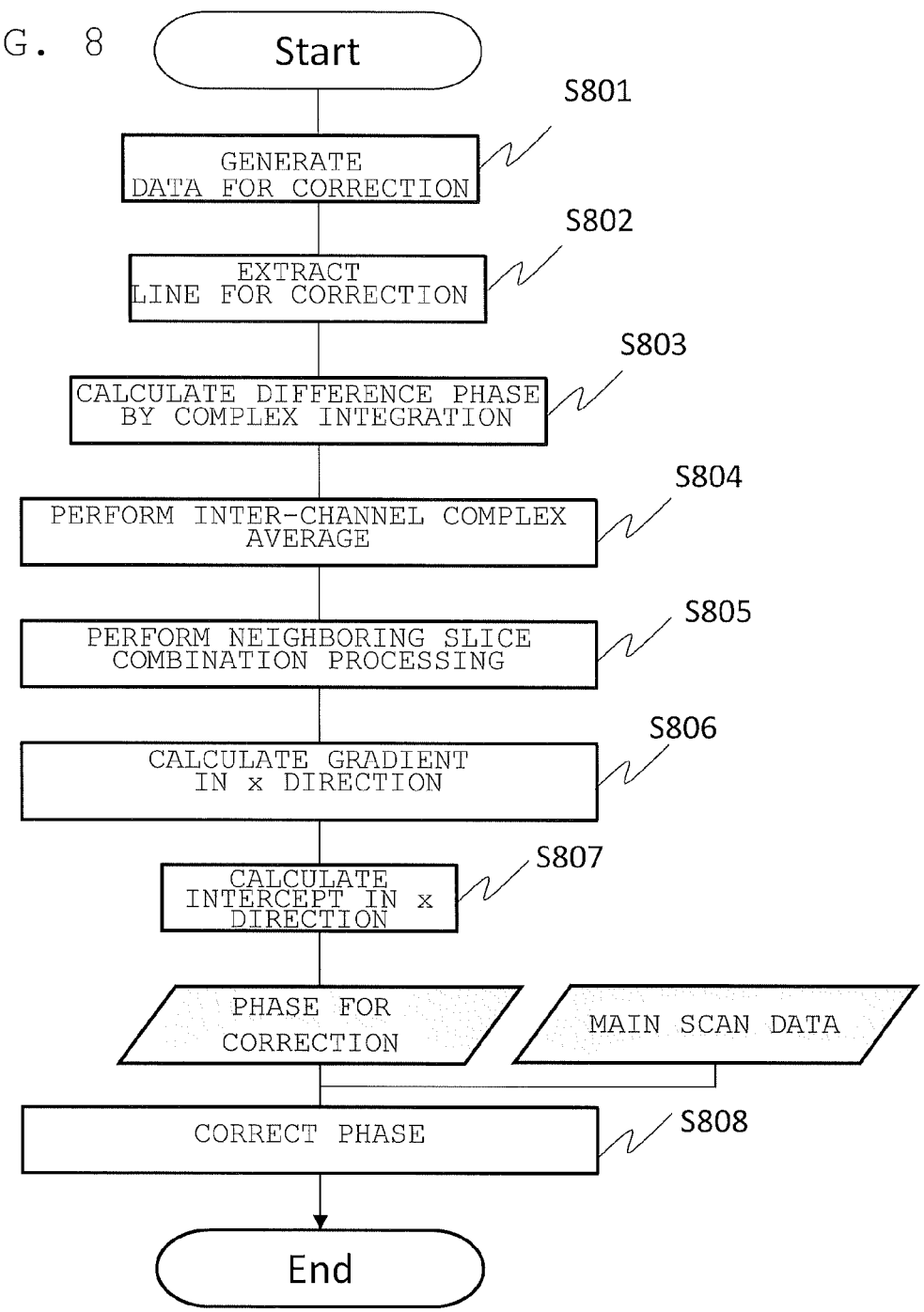

<PHASE MAP OF x-K$_Y^{(')}$ SPACE>

BEFORE DATA DIVISION

1acq  2acq

AFTER DATA DIVISION

ODD

EVEN

AFTER PHASE DIFFERENTIATION

ODD

EVEN

MAGNETIC RESONANCE IMAGING APPARATUS, IMAGE PROCESSING APPARATUS, AND PHASE CORRECTING METHOD

BACKGROUND OF THE INVENTION

1. Field of the Invention

The present invention relates to a magnetic resonance imaging apparatus (hereafter, referred to as "MRI apparatus"), and particularly, to a technique of correcting a phase when EPI method-based imaging is performed using a plurality of receiving coils.

2. Description of the Related Art

Echo Planar Imaging (EPI) is one of high-speed imaging methods using an MRI apparatus, and is used for various types of imaging, such as imaging for obtaining a diffusion-weighted image. The EPI has an advantage that a signal can be obtained at a high speed since data in a k-space (Fourier space) in which magnetic resonance signals (NMR signals) are arranged can be obtained by one-time excitation. However, when an NMR signal is obtained as an echo signal while a readout gradient magnetic field is inverted, problems occur, such as an N/2 artifact is generated due to an application error of the gradient magnetic field and distortion caused by non-uniformity of a static magnetic field or the like and positional shift in a phase encoding direction is likely to occur.

For these problems, various N/2 artifact correcting methods and phase correcting techniques have been proposed. For example, a method of correcting a positional shift in the kx-y-direction by correcting a phase error of data in the x-ky space based on data obtained by pre-scan is proposed (JP-A-2019-162370). According to this method, the N/2 artifact and positional shift in the y-direction can be reduced.

Meanwhile, as one of the high-speed imaging methods in MRI, there is a parallel imaging (PI) method of obtaining an unfolded image by using a plurality of receiving coils, in which data is thinned out in a phase encoding direction in a k-space to obtain a signal and using sensitivity distribution of these receiving coils to estimate unmeasured data by calculation. In this PI method, EPI can also be used as a method of obtaining a signal, and thereby distortion and blur can be reduced. In this case, it is still necessary to correct a phase error caused by the EPI. However, when phase correction is performed by calculating a phase correction coefficient (correction amount) for each of the receiving coils (also referred to as "channels") and phase-corrected data is combined (synthesized), an error may occur in the phase correction amount due to a difference in SN or the like of each channel, and folded artifacts may occur in the combined image. In the PI method, since the sensitivity distribution of the receiving coils is used, when a shift occurs between the sensitivity distribution and the phase-corrected data, the shift may cause also the folded artifacts.

Japanese Patent No. 6348355 and Japanese Patent No. 6283134 disclose a technique of combining a PI method and EPI and performing phase correction for eliminating positional shift caused by the EPI, and the like. In the technique disclosed in Japanese Patent No. 6348355, in order to solve a problem that a sufficient SNR cannot be obtained depending on a channel when a phase correction coefficient is found from pre-scan data obtained by a plurality of channels of a receiving coil, a phase correction coefficient of a surface coil is calculated using an NMR signal received by a body coil provided separately from the surface coil with a plurality of channels, and thereby the NMR signal received by the surface coil is corrected. In the technique disclosed in Japanese Patent No. 6283134, intermediate images (a first folded image and a second folded image) of a plurality of channels are generated using first k-space data and second k-space data which have different k-space lines, and a phase difference map is generated based on the intermediate images to correct a phase of an image.

The technique described in Japanese Patent No. 6348355 requires obtaining of an additional signal by the body coil, and when a sufficient signal is not obtained by the body coil, the accuracy of the phase correction may be reduced. The technique described in Japanese Patent No. 6283134 requires the generation of intermediate images, and a load on calculation is large. In addition, since a phase difference map is obtained for each channel, when phase correction is performed for data of each channel by the phase difference map of each channel, the problem that folded artifacts occur cannot be solved.

SUMMARY OF THE INVENTION

An object of the present invention is to provide a technique capable of accurately performing phase correction using data for each channel without requiring phase correction of each channel in imaging in which a PI method and EPI are combined.

In order to solve the above problem, in the invention, a common phase correction value to be applied to data of all channels is calculated using pre-scan data of each channel. The common phase correction value is obtained by combining a difference phase obtained for each of the channels. At that time, the combination of the difference phases is performed with a signal value (an absolute value) of each channel being maintained as it is, and averaging processing weighted according to the absolute value is performed.

That is, an MRI apparatus of the invention includes: an imaging unit configured to apply a high-frequency magnetic field pulse and a gradient magnetic field pulse according to a predetermined pulse sequence and collect a magnetic resonance signal generated from an inspection object, and a calculation unit configured to generate an image of the inspection object using the magnetic resonance signal. The imaging unit includes a receiving coil with a plurality of channels, and is configured to execute, as the pulse sequence, a pulse sequence of an EPI method of obtaining a plurality of magnetic resonance signals after a high-frequency magnetic field pulse for excitation is applied one time, and the calculation unit includes a preprocessing unit configured to correct a phase of data including the magnetic resonance signals respectively obtained in the plurality of channels of the receiving coil by executing the pulse sequence of the EPI method. The preprocessing unit includes a correction value calculation unit configured to calculate a phase correction value by using data for correction received in each of the plurality of channels and calculate a common phase correction value by combining the phase correction value of each channel; and a phase correction unit configured to correct a phase of data for image-forming, which is received in each channel, by using the common phase correction value.

A phase correction method of the invention is a phase correction method of correcting a phase of data for image-forming obtained by each of a plurality of channels in a magnetic resonance imaging apparatus including a receiving coil having the plurality of channels, by using EPI sequence, and the phase correction method includes: a step of calculating a phase correction value by using data for correction received in each of the plurality of channels; a step of calculating a common phase correction value by combining the phase correction value of each channel; and a step of correcting a phase of the data for image-forming, which is received in each channel, using the common phase correction value. The step of calculating the phase correction value includes a step of calculating an inter-line difference phase in x-ky space data of the data for correction by complex integration and the phase correction value is calculated based on the difference phase. The step of calculating the common phase correction value includes a step of integrating and averaging the phase correction value of each channel.

According to the invention, by correcting the phase of the data of each receiving coil using the common phase correction value, folded artifacts caused by a difference in the phase correction value of each channel are avoided, and an MR image without positional shift and artifacts can be provided. In addition, robust correction can be performed with high accuracy by calculating the common phase correction value so as to be weighted by the signal value (the absolute value) of the data of each receiving coil. Further, division by zero at the time of calculating the difference can be prevented, and the channel combination can be easily and stably realized.

BRIEF DESCRIPTION OF THE DRAWINGS

FIG. 3A illustrates an example of a single-shot EPI, FIG. 3B illustrates an example of a multi-shot EPI, and FIG. 3C illustrates a case where the single-shot EPI is performed twice;

FIG. 8 is a diagram illustrating a processing flow of x-direction correction according to the first embodiment;

FIG. 13A illustrates data of each shot, FIG. 13B illustrates data after division into patterns, and FIG. 13C illustrates data after phase differentiation;

DESCRIPTION OF THE PREFERRED EMBODIMENTS

Embodiments of an MRI apparatus and an image processing method of the invention will be described below.

Figure 1:
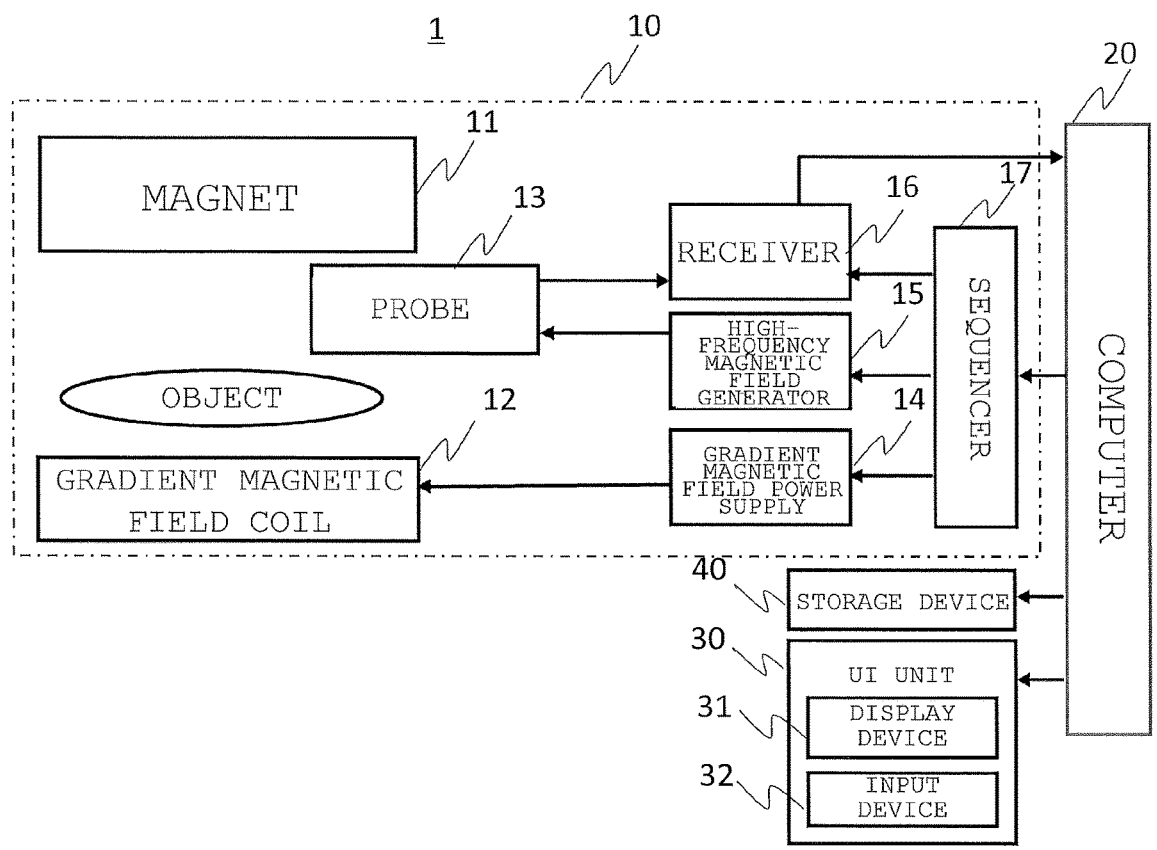
FIG. 1 is a diagram illustrating an overall configuration of an MRI apparatus.

First, with reference to FIG. 1, an overall configuration of an MRI apparatus 1 to which the invention is applied will be described. As illustrated in FIG. 1, the MRI apparatus includes an imaging unit 10, a computer 20, a user interface (UI) unit 30, and a storage device 40. The UI unit 30 allows a user to input a command necessary for an operation of the MRI apparatus and displays an image imaged by the MRI apparatus, a UI necessary for the input, and the like, and includes a display device 31, an input device 32, and the like. The storage device 40 may be a portable medium, an HDD, or the like directly connected to the MRI apparatus, or may be a storage medium on a server or a cloud connected to the MRI apparatus via a network or the like.

The imaging unit 10 includes: a static magnetic field magnet (magnet) 11 that generates a static magnetic field in a space (an imaging space) in which a subject is placed; a gradient magnetic field coil 12 that provides a magnetic field gradient to the static magnetic field; and a probe 13 that applies a high-frequency magnetic field to the subject and detect an NMR signal generated from the subject.

The static magnetic field magnet 11 may be of a permanent magnet type, an electromagnet type, a superconducting type, and the like depending on a method of generating the static magnetic field, and may be of a vertical magnetic field type and a horizontal magnetic field type depending on a direction of the static magnetic field in the imaging space. The invention can adopt any one of the above types.

The gradient magnetic field coil 12 includes three groups of coils that generate gradient magnetic fields in three axial directions of X, Y, and Z orthogonal to one another, each group of coils is connected to a gradient magnetic field power supply 14 and generates a gradient magnetic field pulse having a desired magnitude by a current supplied from the gradient magnetic field power supply 14. A gradient magnetic field in any direction with respect to the imaging space can be generated by a combination of currents flowing through the coils of the three axes. In general, gradient magnetic field pulses in three axial directions including a slice direction, a phase encoding direction, and a readout direction (also referred to as a frequency encoding direction) are generated, and thereby position information is added to the NMR signal. In addition, a shim coil for correcting non-uniformity of the static magnetic field may be provided, and the gradient magnetic field coil 12 may also be used as the shim coil.

Although not illustrated, the probe 13 includes a transmission RF coil that generates a high-frequency magnetic field pulse (referred to as an RF pulse), and a reception RF coil that receives the NMR signal generated from the subject, the transmission RF coil is connected to a high-frequency magnetic field generator 15, and the reception RF coil is connected to a receiver 16. One of these coils may be used for both transmission and reception, or separated coils may be prepared. When one coil is used for both transmission and reception, a switch (not shown) is inserted between the high-frequency magnetic field generator 15 and the receiver 16. In the present embodiment, at least a coil functioning for reception is a multi-channel coil where a plurality of coils are arranged, and each of the coils is connected to the receiver 16 respectively. The receiver 16 includes a reception amplifier, a quadrature detection circuit, an A/D converter, and the like, and a digitized signal is sent to the computer 20.

The imaging unit 10 further includes a sequencer 17 that operates the gradient magnetic field power supply 14, the high-frequency magnetic field generator 15, and the receiver 16 according to a predetermined pulse sequence. At the time of imaging, a pulse sequence determined by an imaging method is set in the sequencer 17, and the sequencer 17 controls a magnitude and application timing of the RF pulse and the gradient magnetic field pulse, which are generated by the transmission RF coil and the gradient magnetic field coil 12, the sampling time of the NMR signal by the receiver 16, and the like according to the set pulse sequence.

As the pulse sequence, various pulse sequences which differ depending on the imaging method are pre-stored as a program in a memory in the computer 20 or the storage device 40, and the computer 20 calculates a pulse sequence (an imaging sequence), which is to be actually used for imaging, using a pulse sequence selected according to the imaging method and imaging parameters set via the UI unit 30, and sets the pulse sequence in the sequencer 17. In the present embodiment, an EPI sequence is executed as a basic pulse sequence.

Figure 2:
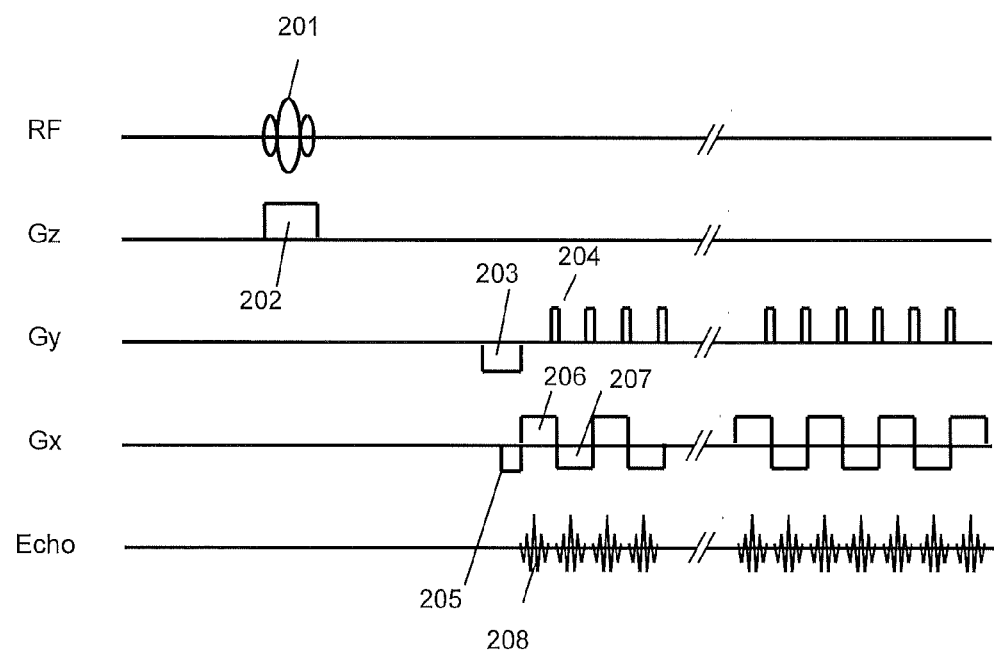
FIG. 2 is a diagram illustrating an example of an EPI sequence.
Figure 3A:
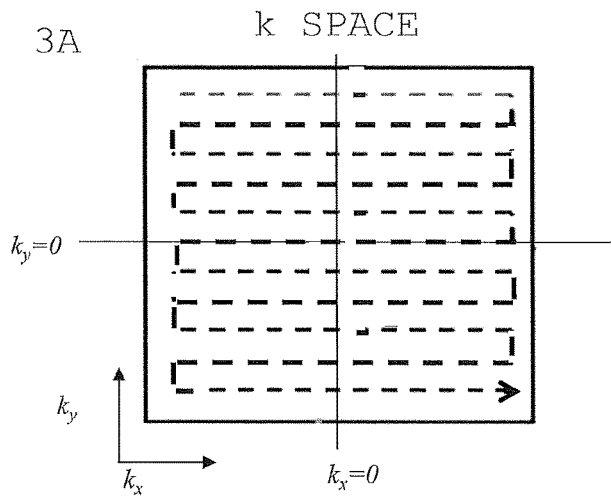
FIGS. 3A to 3C are diagrams illustrating a method of collecting EPI-based k-space data.
Figure 3B:
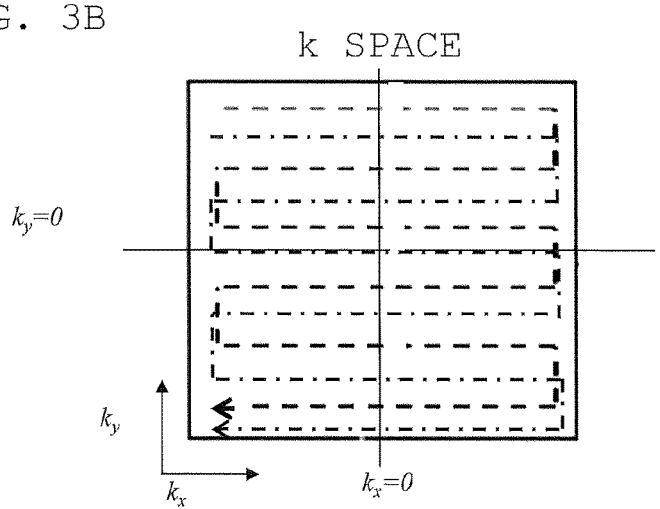
Figure 3C:
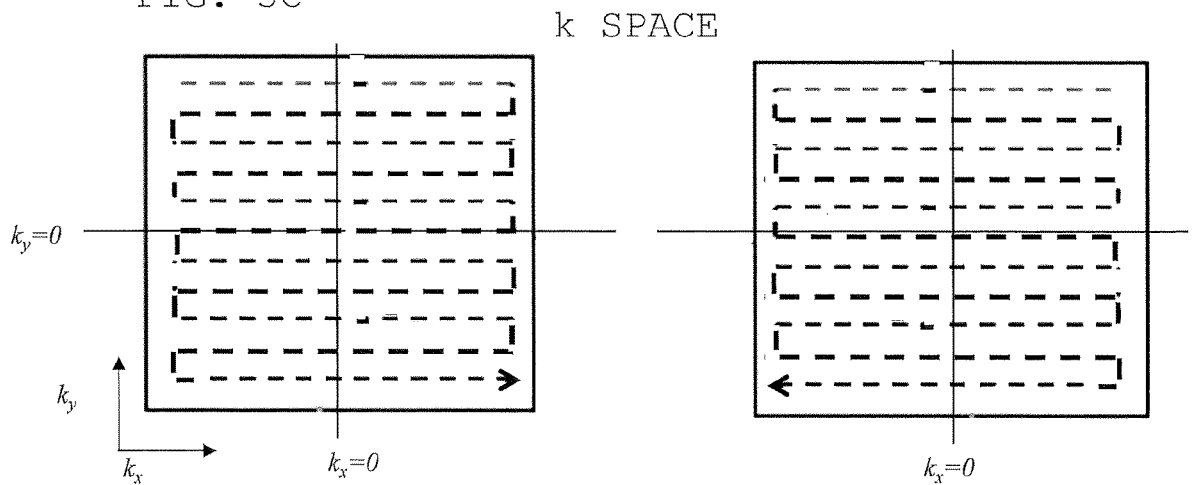

The EPI sequence is a well-known sequence, basically, as illustrated in FIG. 2, after an RF pulse 201 for excitation together with a slice selection gradient magnetic field 202 are applied, de-phase gradient magnetic fields 203 and 205 are applied in the phase encoding direction and the readout direction, gradient magnetic fields 206 and 207 in the readout direction are applied while being inverted to generate a multi-echo 208, and at this time, a blip-shaped phase encoding gradient magnetic field pulse 204 is applied. Thus, as illustrated in FIG. 3A, data of a plurality of lines in the k-space is collected. FIG. 2 shows a 2D sequence, but 3D k-space data can also be obtained by using phase encoding in two directions. In addition, the EPI sequence includes a multi-shot EPI in which k-space data is collected by a plurality of shots as illustrated in FIG. 3B in addition to the single-shot EPI in which k-space data is collected by one excitation (one shot). In addition, although not illustrated, the EPI sequence further includes a multi-shot in which the k-space is divided into a plurality of regions and data in the plurality of regions is collected. In addition, as illustrated in FIG. 3C, the single-shot EPI may be performed twice and the results are averaged. In this case, as illustrated in FIG. 3C, in general, imaging is performed by inverting positive and negative polarities (a direction in which the k-space is scanned). The invention can be applied to any one of these types of EPI. In addition, the k-space data to be collected may be all data occupying the k-space or under-sampled data. The latter is to be image-reconstructed by calculation of the PI method.

The computer 20 can be configured with a general-purpose computer or workstation including a memory, a CPU or GPU, functions as a control unit that controls an operation of each portion of the imaging unit 10, and functions as a calculation unit that performs various calculations for image reconstruction using the NMR signal (the k-space data) collected by the imaging unit 10. However, apart of functions of the calculation unit can also be realized by a computer other than the computer 20 or by hardware such as an ASIC, and an FPGA.

A specific function of the computer 20 will be described with reference to a functional block diagram of FIG. 4.

Figure 4:
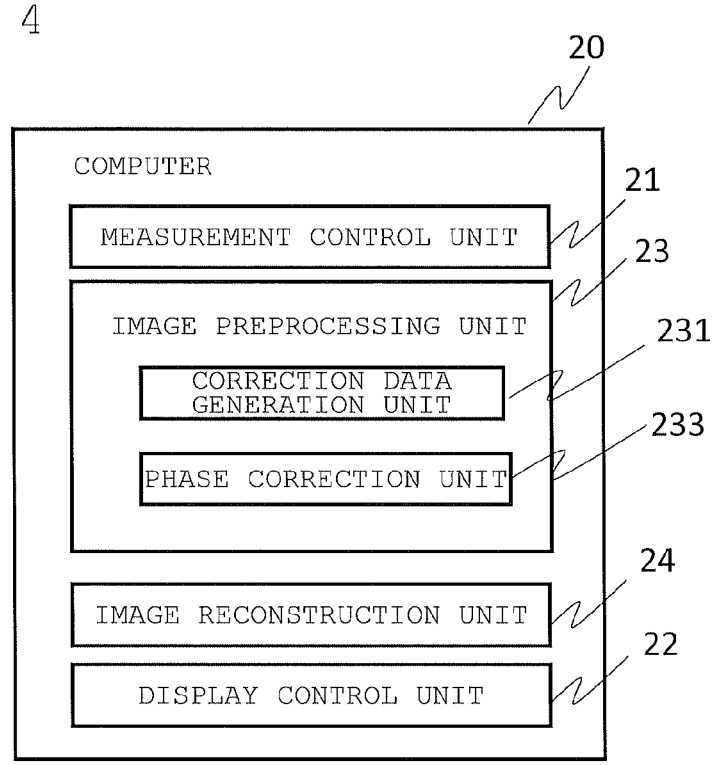
FIG. 4 is a functional block diagram showing a function of a computer.

As illustrated in FIG. 4, the computer 20 includes: a measurement control unit 21 that controls an operation of the imaging unit 10, a display control unit 22 that controls the UI unit 30 (the display device 31), a preprocessing unit 23 that preprocesses measurement data collected by the imaging unit 10, and an image reconstruction unit 24 that reconstructs an image using the preprocessed measurement data. The preprocessing unit 23 and the image reconstruction unit 24 are mainly included in the functions of the calculation unit.

The measurement control unit 21 calculates a pulse sequence, which is to be used for imaging, using imaging parameters that are set via the UI unit 30, such as an acceleration rate R (a value for determining a reduction rate of the PI method), the number of shots, an echo time TE, a repetition time TR, and controls the operation of the imaging unit 10 via the sequencer 17. In the present embodiment, the measurement control unit 21 performs control to execute measurement (a main scan) for obtaining an image of an inspection object and preliminary measurement (pre-scan) for collecting data necessary for correction of measurement data obtained by the main scan. The pulse sequence of the pre-scan is basically the same as the pulse sequence of the main scan, but at the time of receiving a signal, the signal is obtained without applying the gradient magnetic field in the phase encoding direction.

The display control unit 22 controls a display mode of an MR image to be displayed on the display device 31 and display of a GUI or the like for communicating with the user.

The preprocessing unit 23 corrects the measurement data when the imaging unit 10 executes the EPI sequence, and in the present embodiment of the invention, the preprocessing unit 23 includes: a data for correction generation unit 231 that provides data for calculating a phase correction value (that is, data for correction) based on pre-scan data obtained for each channel, and a phase correction unit 233 that calculates a difference phase based on the data for correction of each channel, calculates a common phase correction value of the channels by combining the difference phases, and corrects a phase of the main scan data using this phase correction value.

Figure 5:
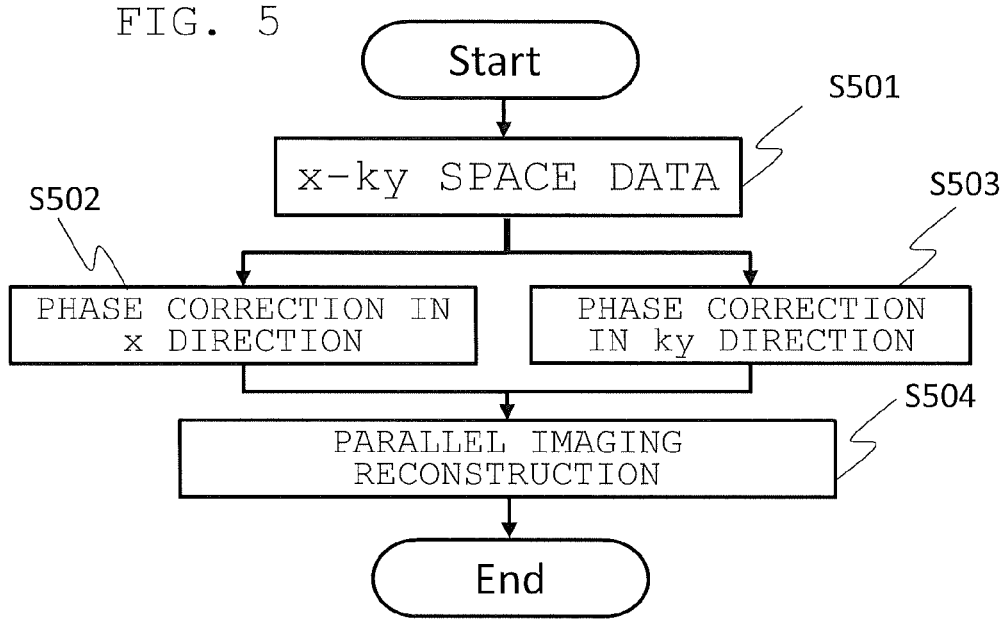
FIG. 5 is a diagram illustrating a flow of phase correcting processing performed by a calculation unit.

The preprocessing unit 23 performs processing in x-ky space. Specifically, as illustrated in FIG. 5, the data for correction generation unit 231 performs Fourier transform on the pre-scan data (the k-space data) in the x-direction to obtain x-ky space data, and prepares, based on the x-ky space data, data for calculating a correction value (S501).

Next, the phase correction unit 233 calculates a correction value and corrects the phase for each of the x-direction and the ky-direction (S502, S503).

A specific calculation method in the phase correction unit 233 will be described below, but in the MRI apparatus of the present embodiment, the phase correction value calculated for each channel is not used for the phase correction in the x-direction and the phase correction in the ky-direction, but a common phase correction value for each channel is calculated and used for the phase correction in the x-direction and the phase correction in the ky-direction. Thus, occurrence of artifacts in a combined image due to variations among channels can be prevented.

Further, when the common phase correction value of the channels is calculated, the phase correction unit 233 obtains a difference phase by complex integration for each channel, performs complex averaging of the difference phase of each channel, and calculates a phase correction value. In this way, the signal value (the absolute value) of each channel can be reflected as a weight in the common phase correction value by adopting the complex integration as a method of calculating the difference phase. As a result, for example, with respect to the data for correction in which the signal value is low and the phase correction value is not accurately obtained, the weight in the common phase correction value is low, so that the accuracy of the common phase correction value is increased. In addition, division by zero at the time of obtaining the difference phase can be prevented by using the complex integration, and the channel combination can be stably realized.

The phase correction unit 233 performs phase correction using the phase correction value on the data collected by the main scan. At this time, the phase correction in the x-direction and the phase correction in the ky-direction can be performed independently.

The image reconstruction unit 24 performs calculations such as Fourier transformation on the phase-corrected main scan data to reconstruct an image of the subject (S504). In a case where the main scan is performed in an acceleration rate larger than 1, that is, in a case of imaging by the PI method, an image in which a fold occurring in the image due to under-sampling is developed is generated by using the calculation of the PI method. As the calculation of the PI method, a method (SENSE) of removing a fold in a real space, a method (GRAPPA) of estimating unmeasured data in a measurement space, and the like are known, and any method can be adopted, but in the present embodiment, the SENSE method is used and will be described.

In the calculation of the SENSE method, the fold of an image is removed using the sensitivity distribution of the receiving coils. Here, phase shift between the sensitivity distribution of the receiving coils and the measurement data can be eliminated by performing the phase correction before the calculation of the SENSE method, and therefore the deterioration of the image quality caused by the phase shift can be prevented.

A specific embodiment of the processing in the preprocessing unit 23 will be described below.

First Embodiment

In the present embodiment, a common phase correction value is calculated using pre-scan data obtained for each channel by 2D-EPI in which a single shot is performed twice to be averaged. In addition, although not essential, phase difference data of neighboring slices are combined, and a common phase correction value is calculated using the combined phase difference data. In k-space scan in which of the single shot EPI is performed twice and averaged in the present embodiment, as illustrated in FIG. 3C, application direction of a read gradient magnetic field is reversed, that is, a scan direction in the k-space is reversed between the first scan and the second scan. Therefore, the obtained data for correction is a set of data in which the scan directions are opposite to each other.

Figure 6:
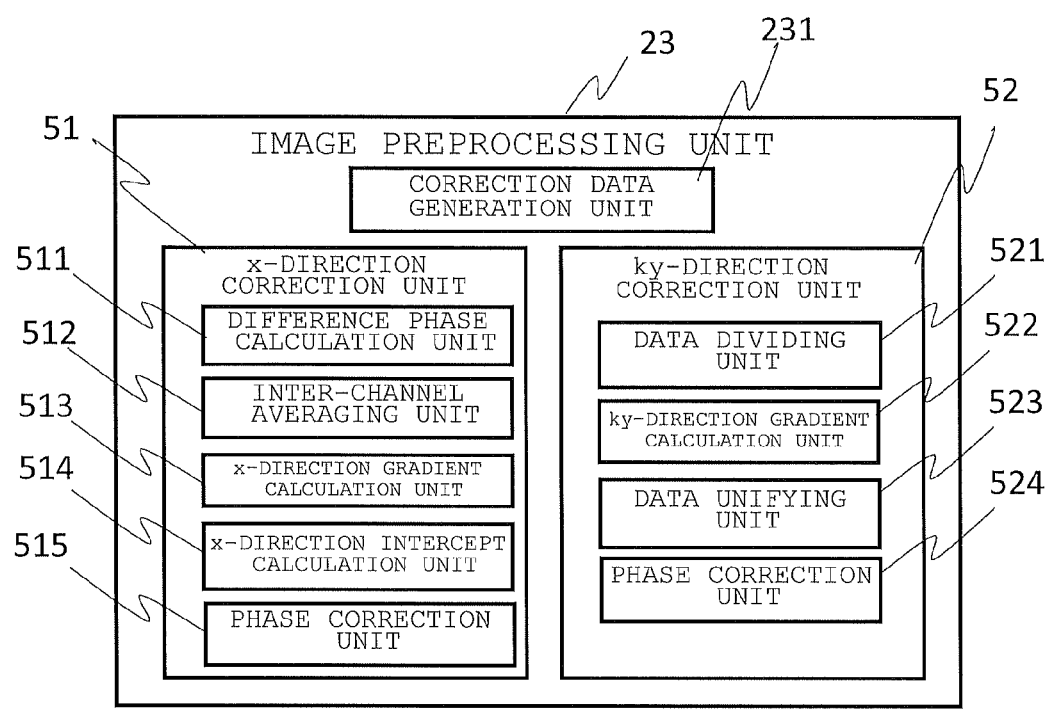
FIG. 6 is a functional block diagram illustrating a function of a preprocessing unit according to a first embodiment.

The details of the processing of the present embodiment will be described with reference to FIGS. 6 to 8 below. FIG. 6 is a functional block diagram illustrating a function of the preprocessing unit 23 according to the embodiment.

As illustrated in FIG. 6, the preprocessing unit 23 of the present embodiment includes an x-direction correction unit 51 that corrects a phase in a reading direction (an x-direction) and a ky-direction correction unit 52 that corrects a phase in a phase encoding direction. The correction in the x-direction mainly corrects a phase difference which occurs between lines in the k-space and which is unique to EPI. The correction in the ky-direction corrects a phase error which occurs in the phase encoding direction due to the non-uniformity of a static magnetic field or the like.

Figure 7A:
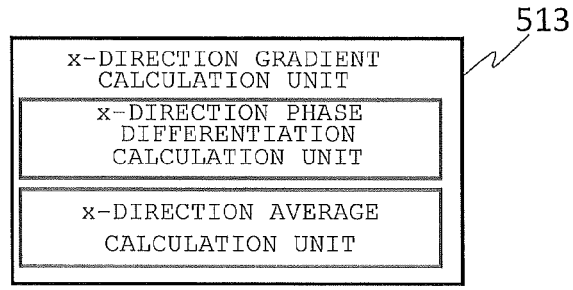
FIGS. 7A to 7C are diagrams illustrating details of an x-direction gradient calculation unit, an x-direction intercept calculation unit, and a ky-direction gradient calculation unit in FIG. 6, respectively.
Figure 7B:
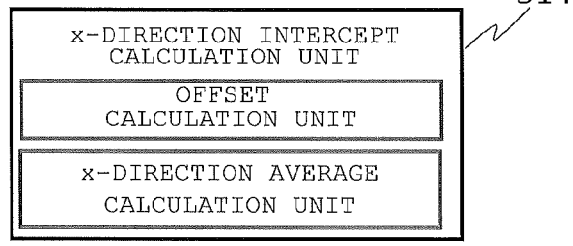

The x-direction correction unit 51 further includes a difference phase calculation unit 511, an inter-channel averaging unit 512, an x-direction gradient calculation unit 513, an x-direction intercept calculation unit 514, and a phase correction unit 515. As illustrated in FIG. 7A, the x-direction gradient calculation unit 513 further includes an x-direction phase differentiation calculation unit and an x-direction average calculation unit. As illustrated in FIG. 7B, the x-direction intercept calculation unit 514 includes an offset calculation unit and an x-direction average calculation unit.

Figure 7C:
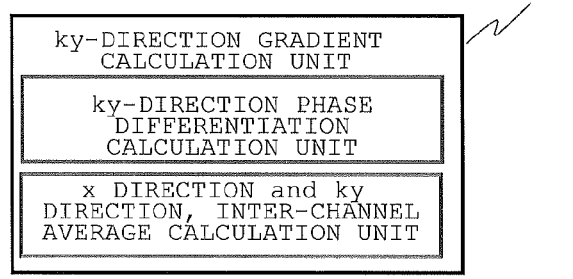

The ky-direction correction unit 52 includes a data dividing unit 521 that divides pre-scan data used for correction, a ky-direction gradient calculation unit 522 that calculates a gradient in the ky-direction for the divided data, a data unifying unit 523 that unifies the gradient of the divided data in the ky-direction, and a phase correction unit 524. As illustrated in FIG. 7C, the ky-direction gradient calculation unit 522 further includes a ky-direction phase differentiation calculation unit and an inter-channel average calculation unit that calculates an inter-channel average in the x-direction and the ky-direction.

Next, a flow of the preprocessing of the embodiment based on the above configuration will be described. First, a flow of the x-direction correction will be described with reference to FIG. 8. As illustrated in FIG. 8, the x-direction correction includes: a step S801 of Fourier-transforming the pre-scan data (the k-space data) obtained by the imaging unit 10 in the x-direction to obtain data for correction value calculation (the x-ky space data) for each channel, a step S802 of extracting a line used for correction in the x-ky space data, a step S803 of calculating a difference phase by complex integration by using data of the extracted line, a step S804 of obtaining an inter-channel average of the difference phase calculated in step S803 by complex average; a step S805 of combining the complex-averaged difference phases between neighboring slices, a step S806 of calculating a gradient in the x-direction by using the combined difference phase, a step S807 of calculating an intercept in the x-direction, and a step S808 of correcting a phase of the data obtained in the main scan for each channel by using the gradient and intercept in the x-direction (collectively referred to as a "phase correction coefficient") obtained in the steps S806 and S807 respectively. The details of the processing of each step will be described below.

(Step S801)

In this step, the preprocessing unit 23 (the data for correction generation unit 231) obtains the x-ky space data by Fourier transforming the k-space data obtained by averaging the results of the two single shots in the x-direction. Since the data is collected in such a manner that scanning directions of the first scan and the second scan are opposite to each other, in the x-ky space data, a phase shift (a phase shift in the x-direction) caused by a shift in symmetry of a gradient magnetic field shape occurs between adjacent lines.

(Step S802)

The x-direction correction unit 51 corrects the above-mentioned phase shift in the x-direction. For the correction, a line (a line in the ky-direction) used for the phase correction in the x-direction is extracted from the x-ky space data. The line to be extracted is, for example, a line corresponding to ky=0 at which the signal value is maximum.

(Step S803)

The difference phase calculation unit 511 calculates the difference phase by a complex integration of first line data and second line data. When the first line data is set to $l_1$ and the second line data is set to $l_2$, a difference phase d can be calculated by Equation (2) based on complex integration $d_s$ represented by Equation (1).

$$d_S(x, z, ch) = l_1(x, z, ch) l_2^*(x, z, ch) \quad \text{[Equation 1]}$$

$$d(x, z, ch) = \sqrt{|d_S|} \cdot \exp\{i \cdot \arg(d_S)\} \quad \text{[Equation 2]}$$

In Equation (1), "$l^*_2$" represents a complex conjugate of "$l_2$". In Equation (1) and Equation (2), x represents a position in the x-direction, z represents a position in the slice direction, and ch represents a channel number (the same applies hereinafter). A difference is calculated for a phase by performing such complex integration, and a signal value (an absolute value) is integrated. The signal value, that is squared by integration, is subjected to a squared root operation and returned to a first power in Equation (2).

Figure 9:
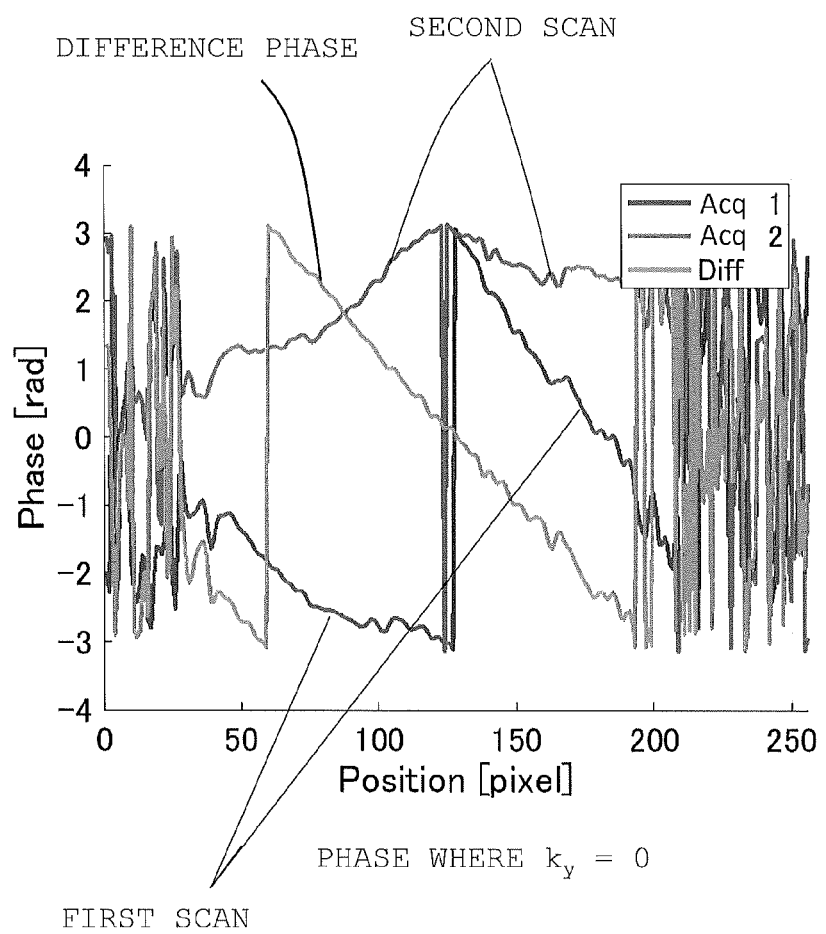
FIG. 9 is a diagram illustrating calculation of a difference phase.

As illustrated in FIG. 9, a first-order component corresponding to a positional shift of a k-space peak in a positive direction and a negative direction can be obtained by complex-integrating the phase of the first data and the phase of the second data. In addition, in Equation (1), a difference phase can be calculated with the signal amount being maintained as it is, by performing the complex integration instead of complex division. Since an absolute value of d corresponds to the signal amount, the signal amount is reflected in the reliability of the difference phase.

(Step S804)

The inter-channel averaging unit 512 calculates an inter-channel average c of the difference phases calculated by Equation (2). The inter-channel average c is calculated by complex average using Equation (3). The absolute value is maintained by calculating the inter-channel average c using the complex average, and here, weighting based on the absolute value of each channel is also performed.

$$c(x, z) = \frac{\sum_{ch} d(x, z, ch)}{n_{ch}} \quad \text{[Equation 3]}$$

In Equation (3), "$n_{ch}$" represents the number of the channels.

(Step S805)

In 2D imaging, data is obtained by dividing a predetermined region into a plurality of slices (z in Equation (1) is z>1), and therefore, in this case, difference phases of the plurality of slices in the vicinity of each other are combined by taking the complex average. A number L of slices to be combined is not particularly limited, but the number is set to about several to ten and is determined according to, for example, Equation (4). In the equation, Z is a thickness (for example, 20 mm) of a region to be combined that can be optionally specified, and Slice Gap is a distance between adjacent slices.

$$L = 2 \cdot \text{floor}\left(\frac{Z[\text{mm}]}{SliceGap[\text{mm}]} / 2\right) + 1 \quad \text{[Equation 4]}$$

Figure 10:
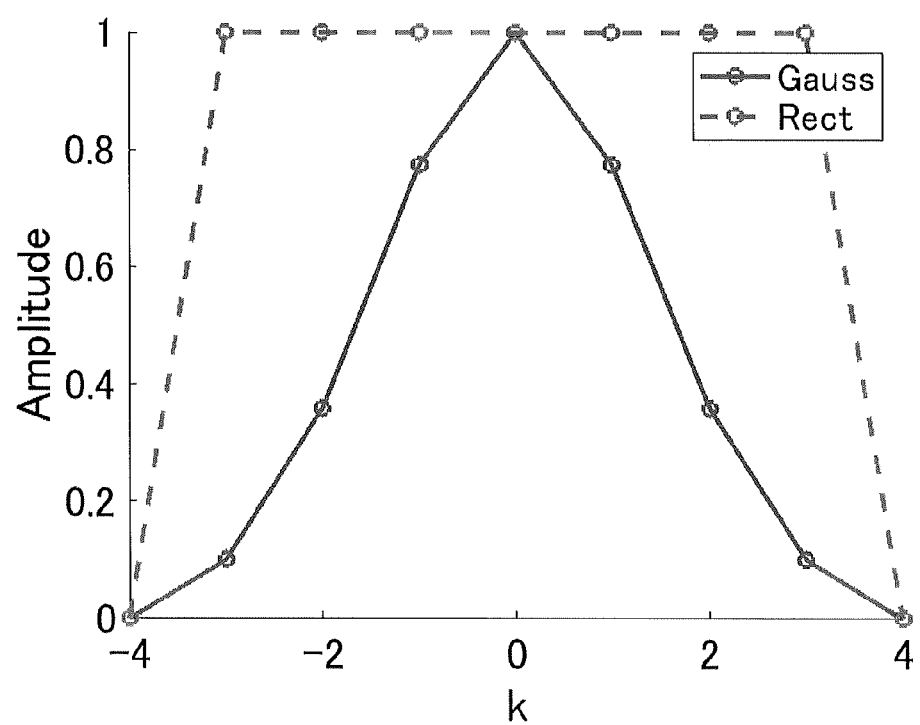
FIG. 10 is a diagram illustrating an example of a kernel function used for slice combination of phase correction values.

A complex average $c_m$ is calculated by a convolution operation using a kernel function g (k) as shown in the following Equation (5). In addition, the kernel function g(k) is, for example, a Gaussian function (solid line) as shown in FIG. 10, and can be defined by Equation (6).

$$c_m(x, z) = \frac{\sum_{k=(L-1)/2}^{(L-1)/2} c(x, z-k) \cdot g(k)}{\sum_k g(k)} \quad \text{[Equation 5]}$$

$$g(k) = \exp(-k^2 / 2\sigma^2) \quad \text{[Equation 6]}$$

$$\sigma = L/5$$

By using such a Gaussian kernel, the closer the slice to the vicinity is, the greater the contribution is, and the phase correction value can be calculated stably and with high accuracy. However, the kernel function is not limited to the Gaussian kernel, and any function can be used according to the number of the slices, the gap between the slices, and the like.

The processing is performed on each slice. Thus, the complex average $c_m$ is obtained for each slice. In addition, this step is not essential for the calculation of the phase correction value, but even when there is some cause of decreasing accuracy in one slice, the influence of the slice can be reduced by performing the slice combination, and robust phase correction can be performed.

(Step S806)

The x-direction gradient calculation unit 513 calculates a gradient in the x-direction using the difference phase cm (x, z) obtained in step S805. For the calculation, first, the x-direction phase differentiation calculation unit performs complex integration according to Equation (7-1) and obtains phase differentiation (phase change per pixel) $c_d$ in the x-direction according to Equation (7-2). Next, the x-direction average calculation unit performs complex average on the phase differentiation $c_d$ of Equation (7-2) using Equation (8) and sets the complex average as a gradient $\alpha_\phi$ in the x-direction.

$$c_{ds}(x, z) = c_m(x, z) c_m^*(x - 1, z) \quad \text{[Equation 7-1]}$$

$$c_d(x, z) = \sqrt{|c_{ds}|} \cdot \exp\{i \cdot \arg(c_{ds})\} \quad \text{[Equation 7-2]}$$

In Equation (7-1) and Equation (7-2), subscript characters "ds" and "d" of "c" represent complex integration and phase differentiation respectively.

$$s(x, z) = c_m(x, z) \cdot \exp\{-i \cdot \phi_0(x, z)\} \quad \text{[Equation 10]}$$

$$\phi_s(z) = \arg\left\{\sum_{x=2}^{n_x} s(x, z) / (n_x - 1)\right\} \quad \text{[Equation 11]}$$

In Equation (8), $n_x$ represents the number of pixels in the x-direction (the same applies hereinafter).

In Equation (7-1) and Equation (7-2), the complex integration is also used in the calculation of the phase differentiation, thus a signal value ($|c_{ds}|$) thereof is included as a weight when the complex average is performed in Equation (8), and robustness is improved.

(Step S807)

The x-direction intercept calculation unit 514 calculates an intercept using the gradient $\alpha_\phi$ of the phase calculated in step S806. For the calculation, first, a phase of a reference position is obtained. The reference position is any position, and is, for example, Fourier center (a center position of the data). In this case, a phase (a temporary phase) $\phi_0$ can be represented by Equation (9). In Equation (9), $x_0$ is a coordinate of the reference position (the Fourier center).

$$\phi_0(x, z) = \alpha_\phi(z)(x - x_0) \quad \text{[Equation 9]}$$

Next, based on the temporary phase $\phi_0$, an intercept s is obtained as the difference thereof according to Equation (10), and a complex average $\phi_s$ thereof is calculated according to Equation (11) and is used as a phase for correction. By such processing, a phase for correction having no intercept shift can be obtained.

$$\alpha_\phi(z) = \arg\left\{\sum_{x=2}^{n_x} c_d(x, z)/(n_x - 1)\right\} \quad \text{[Equation 8]}$$

(Step S808)

The phase correction unit 515 calculates a phase for correction (a phase correction value) according to Equation (12) using the temporary phase $\phi_0$ and the complex average $\phi_s$ of the intercept that are obtained in step S807, and corrects the phase of the main scan data in the x-direction according to Equation (13).

$$\phi_{fit}(x, z) = \phi_0(x, z) + \phi_s(z) \quad \text{[Equation 12]}$$

$$h(x, k_y, z) = \exp(+i \cdot \phi\text{fit}(x, z)/2) \quad \text{[Equation 13-1]}$$

$$h(x, k_y, z) = \exp(-i \cdot \phi\text{fit}(x, z)/2) \quad \text{[Equation 13-2]}$$

Figure 11:
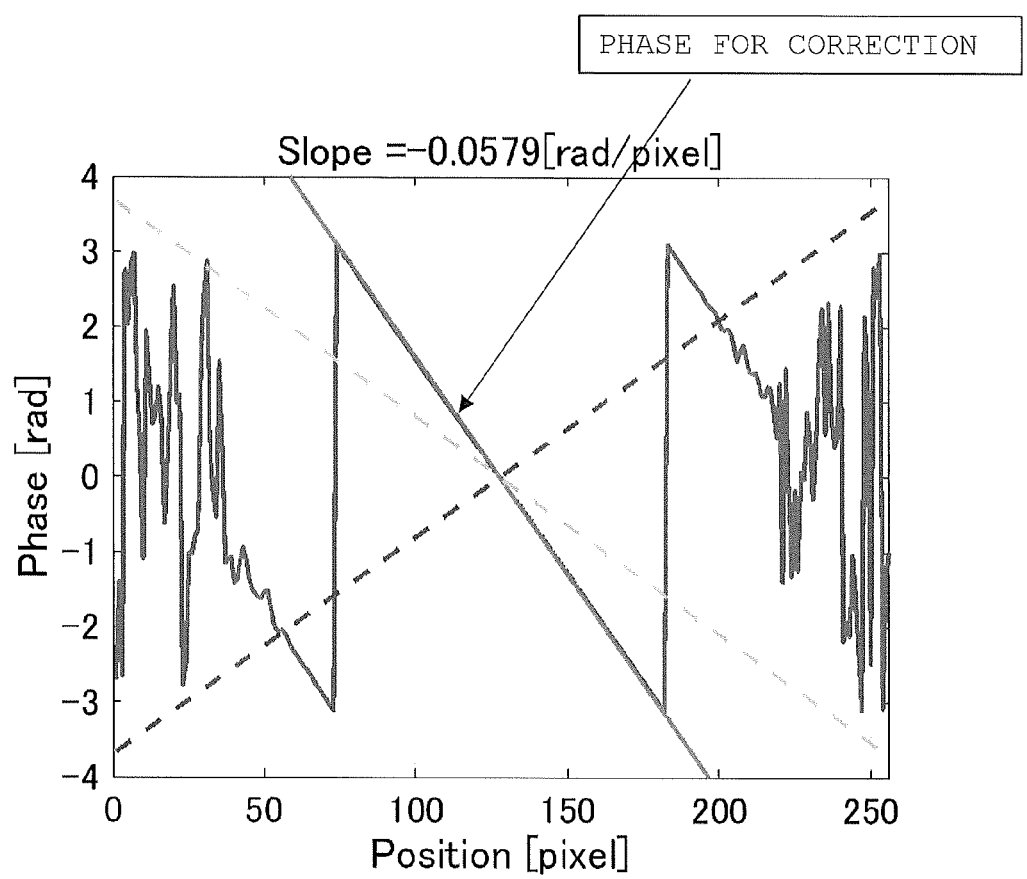
FIG. 11 is a diagram illustrating calculation of a gradient and an intercept in an x-direction.

FIG. 11 illustrates an example of a phase for correction. In FIG. 11, phases shown by dotted lines correspond to Equation (13-1) and Equation (13-2) respectively, and when an odd line and an even line of the main scan data are corrected respectively, the phase is corrected as follows using these lines.

For data of an odd line in the first main scan data and data of an even line in the second main scan data, h(x, ky, z) is complex-divided from the original x-ky space data using Equation (13-1). In addition, for data of an even line in the first main scan data and data of an odd line in the second main scan data, h (x, ky, z) is complex-divided from the original x-ky space data using Equation (13-2).

In addition, for example, only the even line may be corrected and aligned with the odd line by using the phase for correction (a double value) indicated by a solid line in FIG. 11.

Thus, the x-ky space data on which the phase correction in the x-direction is performed is obtained.

The phase correction performed by the x-direction correct unit 51 is described above. Thus, in the phase correction in the x-direction, since the gradient and intercept in the x-direction, which are the phase correction values, are all calculated by the complex average, the phase correction value in which the magnitude of the signal value is maintained can be obtained. In addition, the phase for correction as illustrated in FIG. 11 can be calculated without performing an unstable phase unwrapping and fitting processing, and a common phase correction value can be stably calculated.

Figure 12:
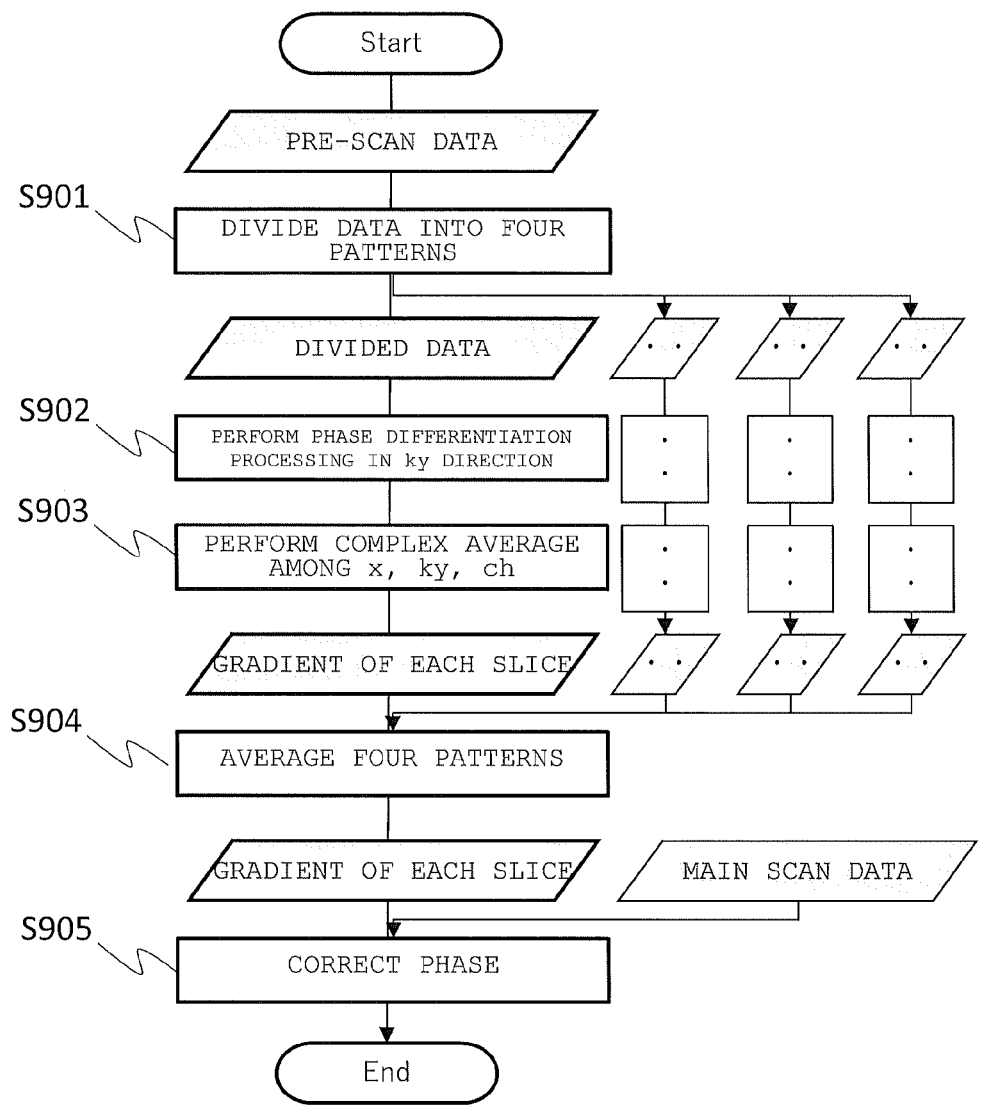
FIG. 12 is a diagram showing a processing flow of ky-direction correction according to the first embodiment.

Next, the processing of the ky-direction correction unit 52 will be described in detail with reference to FIG. 12. FIG. 12 is a flow showing processing in the ky-direction.

The correction in the ky-direction is to divide the data for correction (the x-ky space data generated based on the k-space data obtained in the pre-scan) into a plurality of patterns according to the shot number and whether the data is in an odd line or an even line, and process the patterns. In the processing, first, the data for correct is divided (S901). Next, for each of the divided patterns, a phase differentiation processing (S902) in the ky-direction and complex averaging processing are performed to calculate the gradient in the ky-direction for each slice (S903). Then, the gradient in the ky-direction calculated for each slice of each pattern is averaged to calculate the data for correction (S904). Finally, the phase correction of the main scan data is performed using the data for correction (S905).

The details of each step of the ky-direction correction will be described below.

(Step S901)

In the present embodiment, since the pre-scan data is obtained for each channel by imaging twice, the x-ky space data is divided for each imaging (first data for correction and second data for correction), and the data is further divided into data of an odd line and data of an even line. Thus, the x-ky space data is divided into four patterns: a first odd line, a first even line, a second odd line, and a second even line.

Hereinafter, with respect to data p (Ky, x, z, ch, nsa) before the division (nsa is each imaging number, and may be 1 or 2 in the embodiment), data after the division is described as $p^{1o}$ (Ky', x, z, ch), $p^{1e}$ (Ky', x, z, ch), $p^{2o}$ (Ky', x, z, ch), (and $p^{2e}$ (Ky', x, z, ch). Here, in order to distinguish ky-direction coordinates before and after the division, the former was defined as Ky, and the latter was defined as Ky'.

(Step S902)

Next, phase differentiation in a Ky' direction (a gradient in the Ky' direction) is calculated for the data of each pattern. The phase differentiation is obtained by complex integration between adjacent lines, that is, integration with one of the adjacent lines as a complex conjugate, as in the case of obtaining the gradient in the x-direction (Equation (7-1) and Equation (7-2)). As a representative, a calculation equation with respect to the data $p^{1o}$ (Ky', x, z, ch) of one pattern is shown as the following Equation (14-1) and Equation (14-2). The similar calculation is performed for other patterns to obtain a phase differentiation.

$$p_{ds}^{1o}(K_y', x, z, ch) = p^{1o*}(K_y', x, z, ch) \cdot p^{1o}(K_y' + 1, x, z, ch) \quad \text{[Equation 14-1]}$$

$$p_d^{1o}(K_y', x, z, ch) = \sqrt{|p_{ds}^{1o}|} \cdot \exp\{i \cdot \arg(p_{ds}^{1o})\} \quad \text{[Equation 14-2]}$$

In Equation (14-1) and Equation (14-2), subscript characters "ds" and "d" of "$p^{1o}$" represent complex integration and phase differentiation respectively.

Here, the complex integration is also used in the calculation of the phase differentiation, and thus a signal value ($|p_{ds}|$) thereof is included as a coefficient of the phase differentiation, that is, a weight, and as a result, the robustness is improved. By this step S902, a correction amount corresponding to the positional shift in the y-direction is obtained.

(Step S903)

With respect to the result obtained in step S902, the complex average is performed among pixels in the Ky' direction and the x-direction and among channels (Equation (15)).

$$p_s^{1o}(z) = \frac{\sum_{Ky',x,ch} p_d^{1o}(K_y', x, z, ch)}{n_{Ky'} \cdot n_x \cdot n_{ch}}$$ [Equation 15]

Figure 13A:
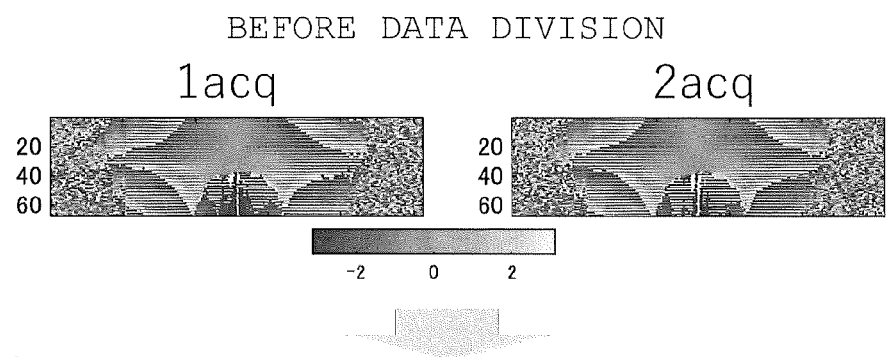
FIGS. 13A to 13C are diagrams illustrating phase maps of x-ky space data.
Figure 13B:
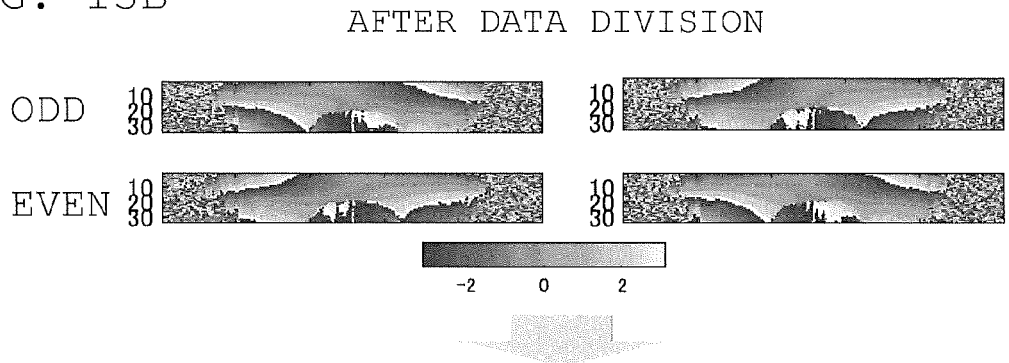
Figure 13C:
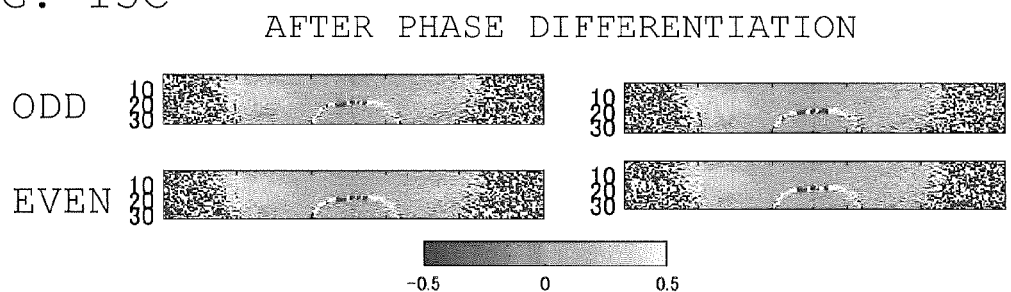

Thus, for each pattern, a positional shift in the y-direction (the gradient in the ky-direction) is obtained. FIGS. 13A to 13C illustrate an example of a change in the data due to the processing of steps S901 to S903 described above. FIG. 13A illustrates phase maps of the first and second x-ky space data of a center slice (for example, a tenth slice) in the imaging region, and FIG. 13B illustrates phase maps after the x-ky space data is divided division into patterns. Thus, by performing processing of dividing the x-ky space data into patterns in this way, as illustrated in FIG. 13C, results obtained by phase differentiation are almost the same in the patterns.

Thus, by dividing and processing the data according to the odd line and the even line, the phase correction value in the ky-direction can be calculated without a precondition of the phase correction in the x-direction. In addition, by dividing the x-ky space data into patterns and processing the patterns, variations depending on the patterns can be averaged and the accuracy of the phase correction value can be improved.

In addition, in Equation (15), an average is calculated for Ky', x, and the channels, but the average may be calculated only for Ky' and the channels. In this case, ps will be a function ps (x, z) related to x and z. When the subsequent phase correction processing is performed using this ps (x, z), not only a difference in the gradient in the ky-direction for each slice can be corrected as in the present embodiment, but also a difference in the gradient in the ky-direction for each position x can be corrected.

(Step S904)

In step S904, gradients for four patterns in the ky-direction calculated according to Equation (15) are averaged, and the correction value is calculated. Since the gradient in the ky-direction of each pattern is calculated based on data of skipping one line (for odd and even lines), a sum of gradient angles is not divided by the number of patterns which is 4, but is divided by 2 as shown in the following Equation (16) when being averaged.

$$\phi_s(z) = \frac{\arg\{p_s^{1o}(z) + p_s^{1e}(z) + p_s^{2o}(z) + p_s^{2e}(z)\}}{2}$$ [Equation 16]

Figure 14:
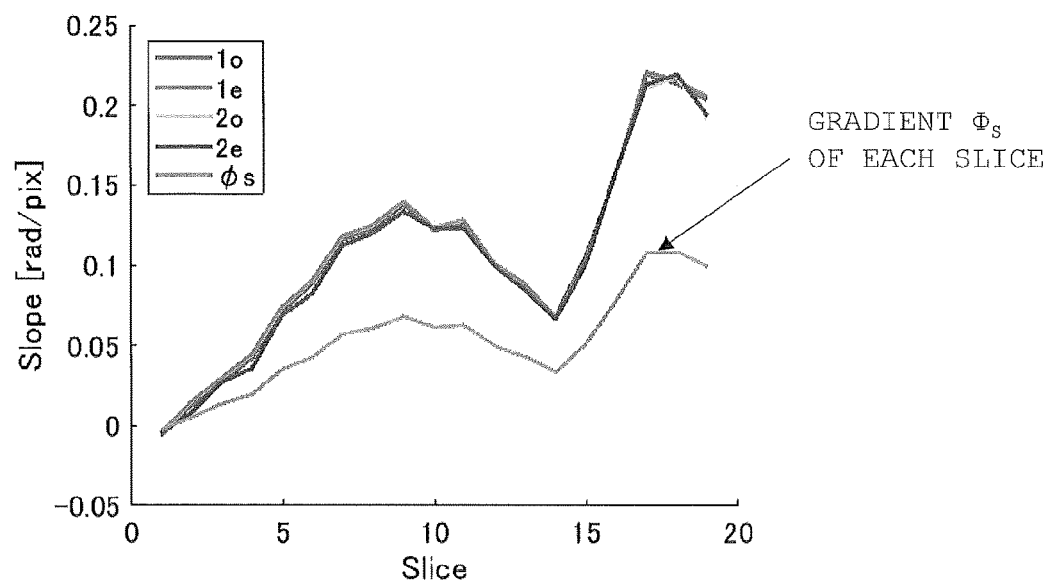
FIG. 14 is a diagram illustrating a gradient in a slice direction calculated as a common phase correction value.

As a result, as illustrated in FIG. 14, a gradient $\phi_s$ in the ky-direction is obtained.

Next, the correction value is calculated according to the following Equation (17) using this gradient $\phi_s$.

$$h_s(x, k_y, z) = \exp(i \cdot k_y \cdot \phi_s(z))$$ [Equation 17]

In addition, in the imaging by the PI method, in the case where a matrix size of the k-space data in which the main scan data is arranged is different from a matrix size of the pre-scan and the like, according to the acceleration rate, $\phi_s$ in Equation (17) may be multiplied by a coefficient for adjusting the difference in size.

(Step S905)

The main scan data on which the above-described phase correction in the x-direction is performed is corrected with the correction value calculated in step S904. The correction is performed in the x-ky space. Specifically, the main scan data (the k-space data) is Fourier-transformed to the x-ky space data in the x-direction, and a correction coefficient hs is complex-integrated with respect to the x-ky space data. Thus, the same correction as the correction of shifting in the y-direction in the real space is performed.

The phase correction in the ky-direction is completed by the above steps.

In the above-described phase correction in the ky-direction, since the data for correction is divided into four patterns to calculate phase correction values, and the results are combined to obtain a phase correction value, the accuracy of calculating a gradient is improved. In addition, since the odd line and the even line are separated and processed, it is not necessary to perform the phase correction in the x-direction beforehand, and thus the processing can be performed as processing independent of the phase correction processing in the x-direction. Further, by combining the four patterns using the complex average, a phase correction value reflecting an absolute value can be obtained, and a gradient can be stably calculated while eliminating phase unwrapping or fitting processing.

Finally, the image reconstruction unit 24 reconstructs an image based on the main scan data after the phase correction. As described above, since the correction in the x-direction and the correction in the y-direction can be performed independently, the phase correction of the main scan data in either direction may be performed first.

As described above, according to the present embodiment, the phase correction values respectively found from the data for correction obtained for each channel are combined using a magnitude (an absolute value) of a signal which differs for each channel as a weight to obtain a common phase correction value, so that a folded artifact that may occur when the phase correction is performed for each channel may be prevented and the measurement data obtained by EPI can be accurately phase-corrected.

In addition, according to the present embodiment, since the complex average is used when the correction value in the x-direction and the correction value in the ky-direction are combined among the channels, the phase unwrapping processing and the fitting processing that generally tends to be unstable can be avoided and the phase correction value can be stably calculated.

Figure 15A:
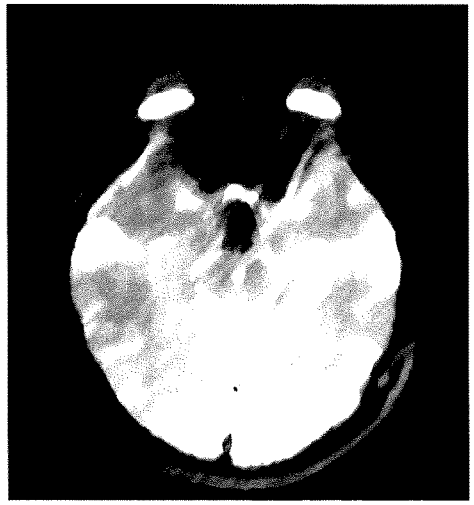
FIGS. 15A and 15B are diagrams illustrating a difference in effect between the present embodiment and a comparative example.
Figure 15B:
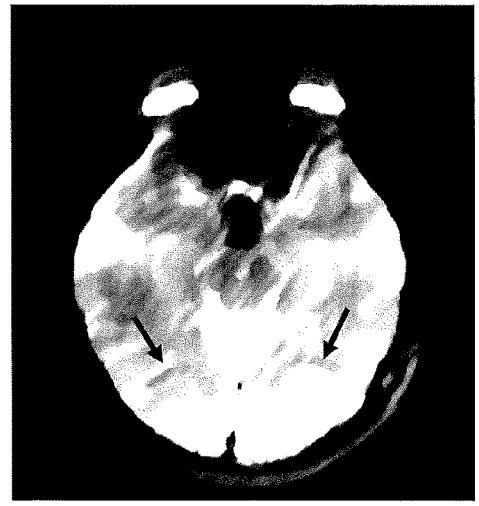

FIG. 15A shows an image reconstructed after the phase correction in the present embodiment and FIG. 15B shows image reconstructed by PI synthesis after the phase correction value is calculated and the phase correction is performed for each channel.

As can be seen from a comparison of these images, when the phase correction is performed for each channel, folded artifacts occur in a part of the image as indicated by black arrows in FIG. 15B, but the occurrence of such artifacts is prevented by performing the processing of the present embodiment.

Modification of First Embodiment

In the first embodiment, a case where the imaging unit 10 performs imaging using the sequence of the PI method is described, but so long as the EPI using a receiving coil with a plurality of channels is performed, the invention can also be applied to imaging in which the acceleration rate is 1, that is, under-sampling is not performed.

In addition, in the first embodiment, the correction phase is calculated using the pre-scan data, but the correction phase can also be calculated using the main scan data. However, since the main scan data is obtained by applying a gradient magnetic field of the phase encoding, it is difficult to independently calculate a phase error in the ky-direction due to magnetic field non-uniformity or the like. Therefore, when the phase correction is performed using the main scan data, the phase correction is performed only in the x-direction. In this case, the phase correction in the ky-direction cannot be performed, but since the pre-scan is not necessary, an imaging time can be shortened.

In addition, in the first embodiment, a case where the phase correction value is calculated using the data of two single shots in which the directions in which the k-space is scanned are reversed is described, but if the scan is performed to obtain a set of line data (the odd line data and the even line data) in which the scan directions are reversed, data of one single shot or data of multiple shots may be used.

In the case of the one single shot, the above-described x-direction correction is performed using an odd line and an even line following the odd line (for example, a line of ky=0 and a line adjacent thereto) as one set. In the correction in the ky-direction, the data for correction may be divided into two patterns of the odd line and the even line to calculate phase correction values, and then the phase correction values are combined.

The present invention is that the common data for correcting the phase of data of the plurality of channels is generated by combining the data for correction of each channel and applied. Therefore, the invention can also be applied to a case where only one of the phase correction in the x-direction and the correction in the ky-direction is performed, and such a technique is also included in the invention.

Figure 16:
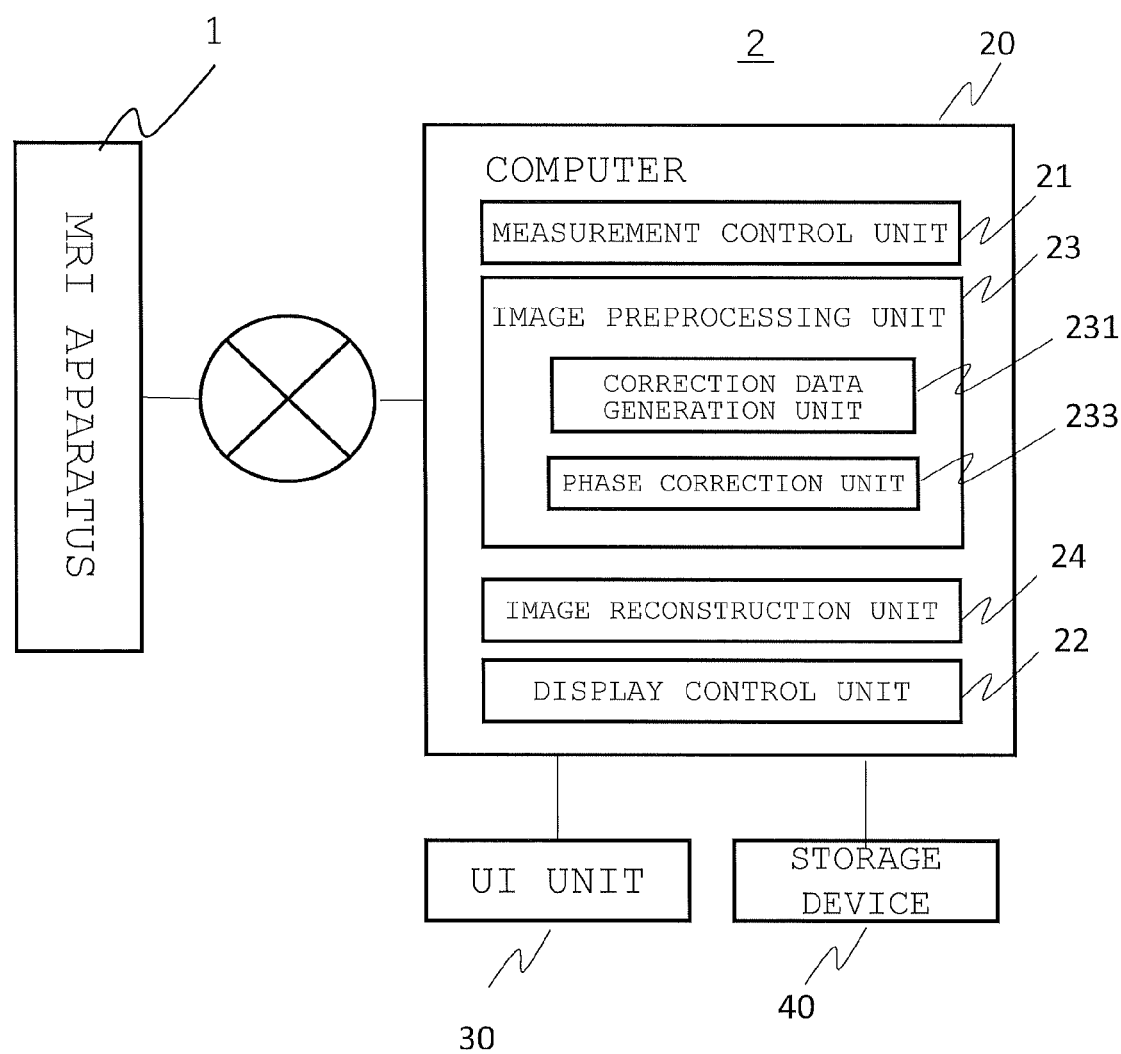
FIG. 16 is a diagram showing an overall configuration of an image processing apparatus.

A case where the invention is applied to the MRI apparatus is described above, but the invention can also be applied to an image processing apparatus 2 independent of the MRI apparatus. FIG. 16 is a diagram illustrating an embodiment of an image processing apparatus to which the invention is applied.

As illustrated in FIG. 16, this image processing apparatus mainly includes the computer 20, the UI unit 30 including a display device, an input device, and the like associated with the computer 20, and the storage device 40. The computer 20 is connected to one or more MRI apparatus 1 via a network or the like and receives data imaged by the MRI apparatus via the network. Alternatively, the data may be received via a portable medium or the like.

The configuration of the computer 20 is the same as the configurations of the computer and the preprocessing unit illustrated in FIGS. 4 and 6, and performs the same operation. That is, the computer 20 calculates phase correction values in the x-direction and the ky-direction using the data for correction collected for each of the plurality of channels of the MRI apparatus, combines the phase correction values to calculate a common phase correction value, and applies this phase correction value to image data to perform the phase correction. Contents of specific processing are also similar, and redundant description will be omitted.

What is claimed is:

1. A magnetic resonance imaging apparatus, comprising:
   an imaging unit configured to apply a high-frequency magnetic field pulse and a gradient magnetic field pulse according to a predetermined pulse sequence and collect a magnetic resonance signal generated from an inspection object; and
   a calculation unit configured to generate an image of the inspection object using the magnetic resonance signal, wherein
   the imaging unit includes a receiving coil provided with a plurality of channels and is configured to execute, as the pulse sequence, a pulse sequence of an EPI method of obtaining a plurality of magnetic resonance signals after a high-frequency magnetic field pulse for excitation is applied one time, the calculation unit includes a preprocessing unit configured to correct a phase of data of magnetic resonance signals respectively obtained in the plurality of channels of the receiving coil by executing the pulse sequence of the EPI method, and
   the preprocessing unit includes a correction value calculation unit configured to calculate a phase correction value by using data for correction received in each of the plurality of channels and calculate a common phase correction value by combining the phase correction value of each channel, and a phase correction unit configured to correct a phase of data for image-forming, which is received in each channel, by using the common phase correction value.

2. The magnetic resonance imaging apparatus according to claim 1, wherein
   the correction value calculation unit is configured to calculate the phase correction value of each channel as a difference phase obtained by complex integration between a set of line data, and calculate the common phase correction value by performing complex average on the difference phases.

3. The magnetic resonance imaging apparatus according to claim 2, wherein
   the correction value calculation unit is configured to calculate, for a plurality of slices, the difference phases calculated for each channel, and combine the difference phases of the plurality of slices.

4. The magnetic resonance imaging apparatus according to claim 3, wherein
   the correction value calculation unit is configured to use a Gaussian kernel function to combine the difference phases of the plurality of slices.

5. The magnetic resonance imaging apparatus according to claim 1, wherein
   the preprocessing unit is configured to convert the data for correction into x-ky space data and perform phase correction value calculation and phase correction using the x-ky space data.

6. The magnetic resonance imaging apparatus according to claim 5, wherein
   the preprocessing unit includes an x-direction correction unit configured to perform phase correction in the x-direction and an ky-direction correction unit configured to perform phase correction in the ky-direction, and the preprocessing unit is configured to calculate the common phase correction value for each of the x-direction correction unit and the ky-direction correction unit.

7. The magnetic resonance imaging apparatus according to claim 6, wherein
   the x-direction correction unit is configured to calculate, for each channel, a difference phase by complex integration between a set of line data in the x-ky space, calculate an inter-channel average difference phase by performing complex average on the difference phase of each channel, calculate a gradient in the x-direction and an intercept in the x-direction based on the inter-channel average difference phase, and set the gradient in the x-direction and the intercept in the x-direction as the common phase correction value.

8. The magnetic resonance imaging apparatus according to claim 6, wherein
the ky-direction correction unit includes a data dividing unit configured to divide data for correction of each channel into a plurality of patterns according to the number of shots of EPI and whether the data is in an even line or an odd line, and the ky-direction correction unit is configured to calculate a phase correction value for each pattern divided by the data dividing unit, then combine the phase correction value of each pattern, and set the combined phase correction value as the common phase correction value in the ky-direction.

9. The magnetic resonance imaging apparatus according to claim 1, wherein
the data for correction is data obtained by pre-scanning performed by the imaging unit.

10. The magnetic resonance imaging apparatus according to claim 9, wherein
the imaging unit is configured to obtain the data for correction and the data for image-forming in the same EPI sequence.

11. The magnetic resonance imaging apparatus according to claim 10, wherein
the imaging unit is configured to execute two EPI sequences in which scan directions of a k-space are opposite to each other, and the preprocessing unit is configured to calculate a phase correction value using data obtained in the two EPI sequences as one set of data.

12. The magnetic resonance imaging apparatus according to claim 1, wherein
the calculation unit includes an image reconstruction unit configured to reconstruct an image by parallel imaging calculation using under-sampled k-space data obtained by the imaging unit.

13. An image processing apparatus configured to reconstruct an image by processing data, which is received by a receiving coil provided with a plurality of channels in a magnetic resonance imaging apparatus, for each channel, the image processing apparatus comprising:
a correction value calculation unit configured to calculate a phase correction value by using data for correction received in each of the plurality of channels and calculate a common phase correction value by combining the phase correction value of each channel;
a phase correction unit configured to correct a phase of data for image-forming, which is received in each channel, by using the common phase correction value; and
an image reconstruction unit configured to reconstruct an image by using the phase-corrected image-forming data.

14. A phase correction method of correcting a phase of data for image-forming, which is obtained using EPI sequence in a magnetic resonance imaging apparatus having a receiving coil with a plurality of channels, by each of the plurality of channels, the phase correction method comprising:
a step of calculating a phase correction value by using data for correction received in each of the plurality of channels;
a step of calculating a common phase correction value by combining the phase correction value of each channel; and
a step of correcting a phase of the data for image-forming, which is received in each channel, using the common phase correction value, wherein
the step of calculating the phase correction value includes a step of calculating an inter-line difference phase in x-ky space data of the data for correction by complex integration, and the phase correction value is calculated based on the difference phase, and
the step of calculating the common phase correction value includes a step of integrating and averaging the phase correction value of each channel.

15. The phase correction method according to claim 14, wherein
the step of calculating the phase correction value includes a step of calculating a phase correction value in the x-direction of the x-ky space and a step of calculating a phase correction value in the ky-direction of the x-ky space, and
the step of calculating the phase correction value in the x-direction and the step of calculating the phase correction value in the ky-direction are executed independently.

* * * * *